US007368999B2

(12) United States Patent
Natzke

(10) Patent No.: US 7,368,999 B2
(45) Date of Patent: May 6, 2008

(54) DC OFFSET CANCELLATION FOR A TRANS-IMPEDANCE AMPLIFIER

(75) Inventor: Brad Anthony Natzke, Rochester, MN (US)

(73) Assignee: JDS Uniphase Corporation, Milpitas, CA (US)

( * ) Notice: Subject to any disclaimer, the term of this patent is extended or adjusted under 35 U.S.C. 154(b) by 100 days.

(21) Appl. No.: 11/456,308

(22) Filed: Jul. 10, 2006

(65) Prior Publication Data

US 2008/0007344 A1 Jan. 10, 2008

(51) Int. Cl.
*H03F 3/08* (2006.01)

(52) U.S. Cl. .................................................... 330/308

(58) Field of Classification Search ................. 330/308
See application file for complete search history.

(56) References Cited

U.S. PATENT DOCUMENTS 5,734,300 A * 3/1998 Yoder ......................... 330/308
6,329,881 B1 * 12/2001 Tachigori .................... 330/308
6,404,281 B1 6/2002 Kobayashi et al. ........... 330/85
6,504,429 B2 1/2003 Kobayashi et al. ........... 330/85
6,771,132 B1 8/2004 Denoyer et al. ............ 330/308
6,803,825 B2 * 10/2004 Chiou et al. ................ 330/308
6,876,259 B2 * 4/2005 Visocchi ..................... 330/308
7,042,295 B2 * 5/2006 Guckenberger et al. .... 330/308
7,265,333 B2 * 9/2007 Ichino et al. ........... 250/214 R

* cited by examiner

*Primary Examiner*—Benny Lee
*Assistant Examiner*—Alan Wong
(74) *Attorney, Agent, or Firm*—Allen, Dyer, Doppelt, Milbrath & Gilchrist, P.A.

(57) ABSTRACT

The invention relates to a DC offset cancellation circuit for a trans-impedance amplifier, which is typically used for converting an input current from a photodiode into an output voltage. The DC offset cancellation circuit utilizes the monitor current from a photodiode monitoring device to cancel the DC offset from the photodiode input current, enabling the conventional feedback circuit in the trans-impedance amplifier to be fully integrated.

19 Claims, 2 Drawing Sheets

DC OFFSET CANCELLATION FOR A TRANS-IMPEDANCE AMPLIFIER

CROSS-REFERENCE TO RELATED APPLICATIONS

The present invention claims no priority.

TECHNICAL FIELD

The present invention relates to a circuit for canceling or reducing DC offset current from a photodiode, and in particular to the use of an existing power monitor circuit to subtract the bulk of the photodiode DC offset current ahead of and independent of the DC cancellation feedback loop to reduce the burden on the offset cancellation circuit.

BACKGROUND OF THE INVENTION

A level restoration circuit in a trans-impedance amplifier removes the DC component, i.e. the average value which carries no information, of an optical signal exiting an optical fiber onto a photodiode in a receiver optical sub-assembly (ROSA), while at the same time keeping the low frequency −3 dB frequency low enough to meet requirements for both Telecom and Data com applications.

With reference to FIG. 1, a conventional TIA circuit, generally indicated at 1, converts the current $I_{PD}$ exiting a photodiode 2, into an output voltage $V_{OUT}$. The photodiode current $I_{PD}$, which enters the TIA circuit 1 at an input terminal 3, includes both a DC component and an AC component. The AC component, which carries the information, must be maintained and sent down an amplification chain 4 to final receiving equipment (not shown), while the DC component should be reduced and if possible eliminated, since many front end unit input circuits are not designed to tolerate much more than 10 μA without additional circuitry. A feedback circuit, generally indicated at 5, removes the DC component by means of negative feedback, e.g. implemented by a feedback amplifier 6/low pass filter (i.e. Capacitor 7) and a bypass transistor 8 combination. There are other ways of removing the DC component of the signal and the present invention will work with many methods of feedback DC removal. The feedback amplifier 6/low pass filter 7 has gain, and removes the AC component of a voltage feedback signal $V_{FB}$, leaving only a DC component $V_{FBDC}$. The capacitor 7 is used to set the low-frequency cutoff that the TIA circuit I requires. The low-frequency cutoff point prevents desired output signal components being subtracted from the input signal. The bypass transistor 8 takes that DC component $V_{FBDC}$ of the voltage feedback signal $V_{FB}$ and generates a DC current $I_{FBDC}$ in the collector 9, which by the action of negative feedback substantially equals the incoming DC current $I_{PDDC}$ from the photodiode 2. Accordingly, the DC component $I_{PDDC}$ is removed from the incoming signal $I_{PD}$ and passed to the ground GRND through the emitter 11 of the bypass transistor 8.

Unfortunately, the photodiode DC current $I_{PD}$ can vary from about 10 uA up to about 1000 uA, which makes a 40 dB of difference between the low and high values. To maintain good performance, the DC component must be subtracted with sufficient accuracy over this entire range. For this reason, the gain of the feedback circuit 5 must be made large enough to account for this wide range of input current. In general, if the DC component of $I_{PD}$ could be maintained at a known, constant value, the feedback circuit 5 would only need to account for the offset generated by the on-chip circuit components. Adding the 40 dB range of the input current, $I_{PD}$, requires an additional 40 dB of gain in the feedback circuit 5. In general, for single-pole systems, increasing the gain in the feedback loop by 20 dB requires that the filtering capacitor 7 be multiplied by a factor of 10 to maintain the same low-frequency response. Accordingly, the 40 dB range of $I_{PD}$ requires 100 times more capacitance making it 100 times more difficult and expensive to integrate on-chip.

U.S. Pat. Nos. 6,404,281, issued Jun. 11, 2002 in the name of Kobayashi et al; U.S. Pat. No. 6,504,429, issued Jan. 7, 2003 to Kobayashi et al; and U.S. Pat. No. 6,771,132 issued Aug. 3, 2004 to Denoyer et al disclose improvements to TIA feedback circuits that include minimizing the upper limit of the low frequency cut off frequency; however, none of these references uses the photodiode power monitor circuit to cancel the dc offset current.

An object of the present invention is to overcome the shortcomings of the prior art by providing a circuit that cancels the dc offset current from a photodiode outside of the offset cancellation feedback loop enabling the TIA's offset cancellation circuitry to be subjected to a drastically narrower input current range and therefore requiring a relatively small gain over the same range of external photodiode input currents.

SUMMARY OF THE INVENTION

Accordingly, the present invention relates to a photodetector amplifier circuit, which is electrically connected to a photodetector and a power monitor. The power monitor generates a monitor current indicative of current drawn through the photodetector. The trans-impedance amplifier circuit is for converting a variable input current signal, which has AC and DC components, from the photodetector into an output voltage. The photo-detector amplifier circuit comprises:

a current mirror circuit for replicating the monitor current forming a replica current, and for subtracting the replica current from the DC component of the variable input current signal producing an DC error current; and a trans-impedance amplifier circuit for converting the variable input current signal into an output voltage.

BRIEF DESCRIPTION OF THE DRAWINGS

The invention will be described in greater detail with reference to the accompanying drawings which represent preferred embodiments thereof, wherein.

DETAILED DESCRIPTION

Figure 1:
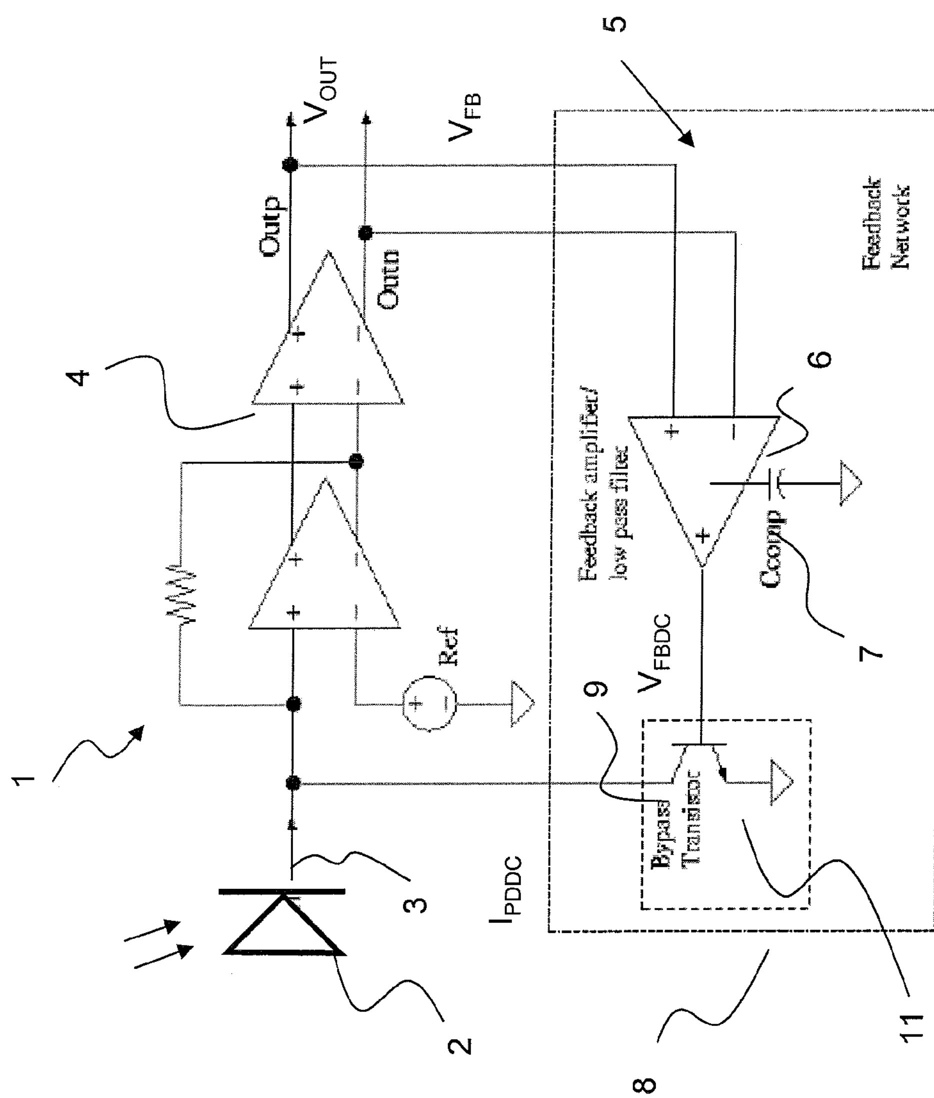
FIG. 1 illustrates a conventional TIA amplifier circuit with feedback circuit.
Figure 2:
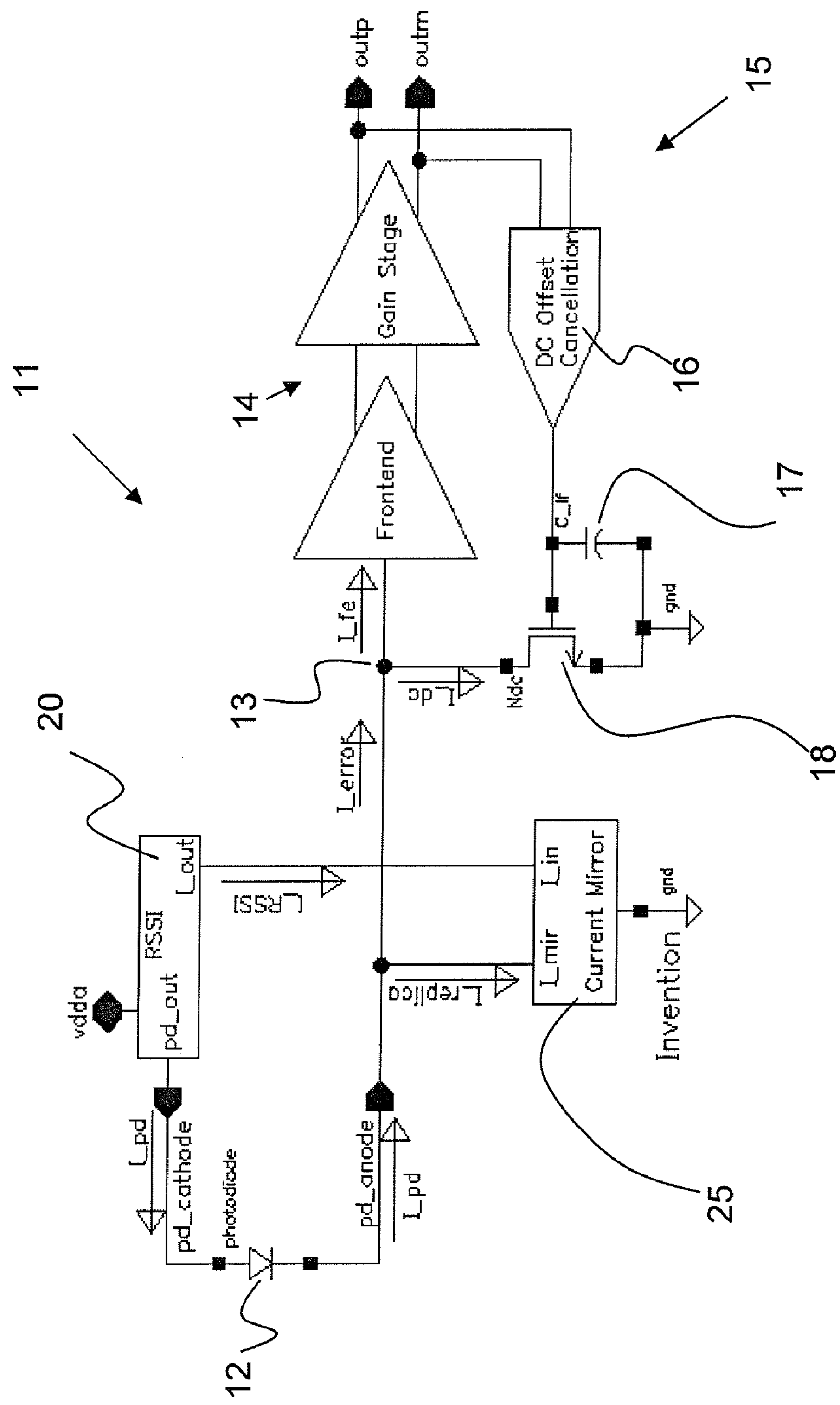
FIG. 2 illustrates a photodetector amplifier circuit according to the present invention.

The present invention solves the aforementioned problem by using the output current from a photodiode monitoring circuit, e.g. a Receive Signal Strength Indicator (RSSI), to cancel the dc offset current from the photodiode before entering the trans-impedance amplifier (TIA). As illustrated in FIG. 2, a TIA circuit 11 receives photodiode current IPD from a photodetector, e.g. photodiode 12, via input terminal 13, and converts the photodiode current IPD to a voltage that is further amplified by an amplification chain 14, thereby producing a differential output voltage $V_{OUT}$=Outp-Outn.

Conventional DC offset cancellation is accomplished by a feedback network 15 including a feedback amplifier 16/low pass capacitor filter 17, and bypass transistor 18 combination, as hereinbefore discussed, integrated on a integrated circuit chip; however other means of DC offset cancellation are possible within the scope of this invention.

A photocurrent monitor function provides a DC signal proportional to the average received optical power, as required by digital diagnostic standards, e.g. SFP, XFP (The 10 Gigabit/second Ethernet XFP MSA is the source of the power monitor circuit spec and application notes, which is incorporated herein by reference). The photocurrent monitor function also allows active optical alignment during the manufacturing process. A conventional power monitor circuit, in the form of an integrated Received Signal Strength Indicator (RSSI) circuit 20 is electrically connected to the photodiode 12 and generates a DC output current $I_{RSSI}$, which accurately replicates the DC current drawn through the photodiode 12. Preferably, the RSSI function resides on the TIA chip inside the ROSA thus eliminating the need for additional external components resulting in a considerable reduction of the assembly costs. For conventional use, the DC output current $I_{RSSI}$ is converted by additional circuitry (not shown) into a digital readout for monitoring the photodiode to ensure the photodiode is operating within design specifications.

The present invention includes a current mirror circuit 25, which also receives the DC output current $I_{RSS}$, at input connection $I_{in}$, and replicates the output current $I_{RSSI}$ forming a mirrored copy, i.e. replicated DC current $I_{replica}$. The current mirror circuit 25 can take any suitable form, including a NFET current mirror, an NPN current mirror or a cascode current mirror, as is well known in the art. The replicated DC current $I_{replica}$ is used to cancel the DC component of the full, signal-laden, AC+DC photodiode current $I_{PD}$. The closer the replicated DC current $I_{replica}$ is to the DC component of the photodiode current $I_{PD}$ the less of a DC error current $I_{error}$ will be transmitted to the trans-impedance amplifier 11. As stated above, the range of the DC component of $I_{PD}$ is about 1000 μA=10 μA=100 which corresponds to approximately 40dB. DC offset cancellation circuits must compensate for this gain by employing a large gain amplifier 16 and consequently a large capacitor 17 for setting the low-frequency cutoff. By subtracting the $I_{replica}$ current, the new input current range for the offset cancellation feedback loop can be reduced to under 10 μA or less than 5 dB depending on the accuracy of the RSSI and mirror circuits. The specified accuracy for RSSI is 3 dB, with an additional 2 dB for the accuracy of the current mirror. When the range of the error current $I_{error}$ has been reduced by 35 dB, the gain of the feedback circuit 15 can also be reduced by 35 dB (40 dB-5 dB=35 dB) and functions primarily to cancel offsets generated internal to the front end and gain stages of the integrated circuit. Accordingly, the size of the feedback capacitor 17 can be at least 50 times smaller while still maintaining the required low-frequency cutoff. The new size can be made to fit "on-chip" instead of as a separate element reducing production costs.

As a secondary function, the capacitor 7 also serves to stabilize the feedback loop 5. It is assumed that the reduction in capacitance doesn't affect the stability of the loop 5, since stability gets much better with lower loop gain, which has been taken out of the loop 5. Moreover, with the amount of capacitance required to achieve the low-frequency range, which is required for Data com and Telecom operation, stability is all but guaranteed. The value of the capacitance is rarely chosen for stability concerns—it is always for the low-frequency cutoff.

The RSSI circuit 20 does not create a feedback loop. The input node on the TIA 11 generates an inherently stable voltage by the nature of the input circuit. As long as the current being subtracted does not take the input circuit out of it's designed operating range, the input voltage will remain controlled. Furthermore, the voltage at the anode of the photodiode 12 has a secondary effect on the amount of current generated for a given amount of light, and this effect is more pronounced at higher frequencies. Therefore, there is very little risk that the DC current that gets subtracted from the photodiode current IPD can affect the average signal coming out of the photodetector 12. As for signal integrity, the voltage signal used to generate the RSSI current (the photodiode cathode) is highly filtered—essentially it is the power supply. Therefore, it is easy to achieve a "DC" signal that won't subtract any useful data signals using on-chip components.

I claim:

1. A photodetector amplifier circuit comprising:

a photodetector for converting an optical signal into a variable input current signal having AC and DC components;

a photodetector power monitor generating a DC monitor current indicative of average current drawn through the photodetector;

a current mirror circuit for replicating the monitor current forming a replica current, and for subtracting the replica current from the DC component of the variable input current signal, thereby reducing the DC component to a DC error current; and a trans-impedance amplifier circuit for converting the variable input current signal, which comprises the AC component and the DC component reduced to the DC error current, into an output voltage.

2. The photodetector amplifier circuit according to claim 1, further comprising a feedback circuit for generating a DC feedback current for canceling at least a portion of the DC error current.

3. The photodetector amplifier circuit according to claim 1, further comprising a feedback circuit generating a feedback voltage signal with AC and DC components from the output voltage, the feedback circuit including:

a feedback amplifier and a capacitor, defining a low frequency cut off, for removing the AC component of the feedback voltage signal; and a bypass transistor, which receives the DC component of the feedback voltage signal and generates a DC feedback current substantially equal to the DC error current for removing the DC error current.

4. The photodetector amplifier circuit according to claim 3, wherein the DC component has a range of 40 dB; wherein the replica current is substantially equal to the DC component, whereby the DC error current has a range of less than 5 dB, thereby enabling the feedback amplifier and the capacitor to be relatively smaller.

5. The photodetector amplifier circuit according to claim 4, wherein the feedback circuit is integrated on an integrated circuit chip; and wherein the capacitor is integrated on the integrated circuit chip.

6. The photodetector amplifier circuit according to claim 5, wherein the photodetector power monitor comprises an integrated receive signal strength indicator (RSSI) circuit integrated on the integrated circuit chip.

7. The photodetector amplifier circuit according to claim 1, wherein the photodetector power monitor comprises an integrated receive signal strength indicator (RSSI) circuit.

8. The photodetector amplifier circuit according to claim 1, wherein the current mirror circuit comprises a circuit selected from the group consisting of an NFET circuit, a NPN circuit, and a cascode circuit.

9. The photodetector amplifier circuit according to claim 1, wherein the photodetector comprises a photodiode.

10. The photodetector amplifier circuit according to claim 1, wherein the DC component has a range of currents of 40 dB, wherein the replica current is substantially equal to the DC component, whereby the DC error current has a range of less than 5 dB.

11. A photodetector amplifier circuit for electrical connection to a photodetector and a power monitor, which generates a DC monitor current indicative of current drawn through the photodetector, the photodetector amplifier circuit for converting a variable input current signal, which has AC and DC components, from the photodetector into an output voltage comprising:

a current mirror circuit for replicating the DC monitor current forming a replica current, and for subtracting the replica current from the DC component of the variable input current signal, thereby reducing the DC component to a DC error current; and a trans-impedance amplifier circuit for converting the variable input current signal, which comprises the AC component and the DC component reduced to the DC error current, into an output voltage.

12. The photodetector amplifier circuit according to claim 11, further comprising a feedback circuit for generating a DC feedback current for canceling at least a portion of the DC error current.

13. The photodetector amplifier circuit according to claim 11, further comprising a feedback circuit generating a feedback current signal with AC and DC components from the output voltage, the feedback circuit including:

a feedback amplifier and low pass filter, defining a low frequency cut off, for removing the AC component of the feedback voltage signal; and a bypass transistor, which receives the DC component of the feedback voltage signal and generates a DC feedback current substantially equal to the DC error current for removing the DC error current.

14. The photodetector amplifier circuit according to claim 13, wherein the feedback circuit comprises an integrated circuit chip; and wherein the low pass filter comprises a capacitor integrated on the integrated circuit chip.

15. The photodetector amplifier circuit according to claim 14, wherein the photodetector power monitor comprises an integrated receive signal strength indicator (RSSI) circuit integrated on the integrated circuit chip.

16. The photodetector amplifier circuit according to claim 11, wherein the photodetector power monitor comprises an integrated receive signal strength indicator (RSSI) circuit.

17. The photodetector amplifier circuit according to claim 11, wherein the current mirror circuit comprises a circuit selected from the group consisting of an NFET circuit, an NPN circuit, a PFET circuit and a cascode circuit.

18. The photodetector amplifier circuit according to claim 11, wherein the DC component of the current has a range of 40 dB, wherein the replica current is substantially equal to the DC component, whereby the DC error current has a range of less than 5 dB.

19. The photodetector amplifier circuit according to claim 18, wherein the DC error current is less than 10 μA.

* * * * *